United States Patent
Hilton

(10) Patent No.: US 6,172,551 B1
(45) Date of Patent: Jan. 9, 2001

(54) WIDE DYNAMIC-RANGE CURRENT SWITCHES AND SWITCHING METHODS

(75) Inventor: Edward Barry Hilton, Wayland, MA (US)

(73) Assignee: Analog Devices, Inc., Norwood, MA (US)

(*) Notice: Under 35 U.S.C. 154(b), the term of this patent shall be extended for 0 days.

(21) Appl. No.: 09/298,108

(22) Filed: Apr. 22, 1999

(51) Int. Cl.[7] .................................................. H03K 17/04
(52) U.S. Cl. .......................... 327/374; 327/307; 327/563
(58) Field of Search .................................. 327/356, 355, 327/359, 333, 306, 307, 560, 563, 383, 403–405, 374–377; 330/252–254, 295, 124 R; 307/115, 131

(56) References Cited

U.S. PATENT DOCUMENTS 5,682,119 * 10/1997 Soda ...................................... 330/252
5,969,579 * 10/1999 Hartke et al. ......................... 332/116
6,049,251 * 4/2000 Meyer ................................... 330/254

OTHER PUBLICATIONS

Paul R. Gray and Robert G. Meyer, *Analysis and Design of Analog Integrated Circuits,* John Wiley and Sons, New York, 1993, pp. 30–45.
Jasprit Singh, *Semiconductor Devices,* McGraw–Hill, New York, 1994, pp. 323–334.

* cited by examiner

*Primary Examiner*—Timothy P. Callahan
*Assistant Examiner*—Minh Nguyen
(74) *Attorney, Agent, or Firm*—Koppel & Jacobs

(57) ABSTRACT

Current switches are arranged to reduce signal transit-time variations when they switch current signals that have a wide range of current magnitudes. The transit-time variations are reduced by shifting the range of currents that are carried by switching transistors. In particular, a current range is shifted upward to a higher current range in which the variation of the transistors' transition frequency $f_T$ is reduced. In general, the switches include a differential pair of transistors, an offset current source that generates an offset current and a current-steering system that steers the offset current along a current path that includes a switched-on transistor but excludes the output port of that transistor.

13 Claims, 5 Drawing Sheets

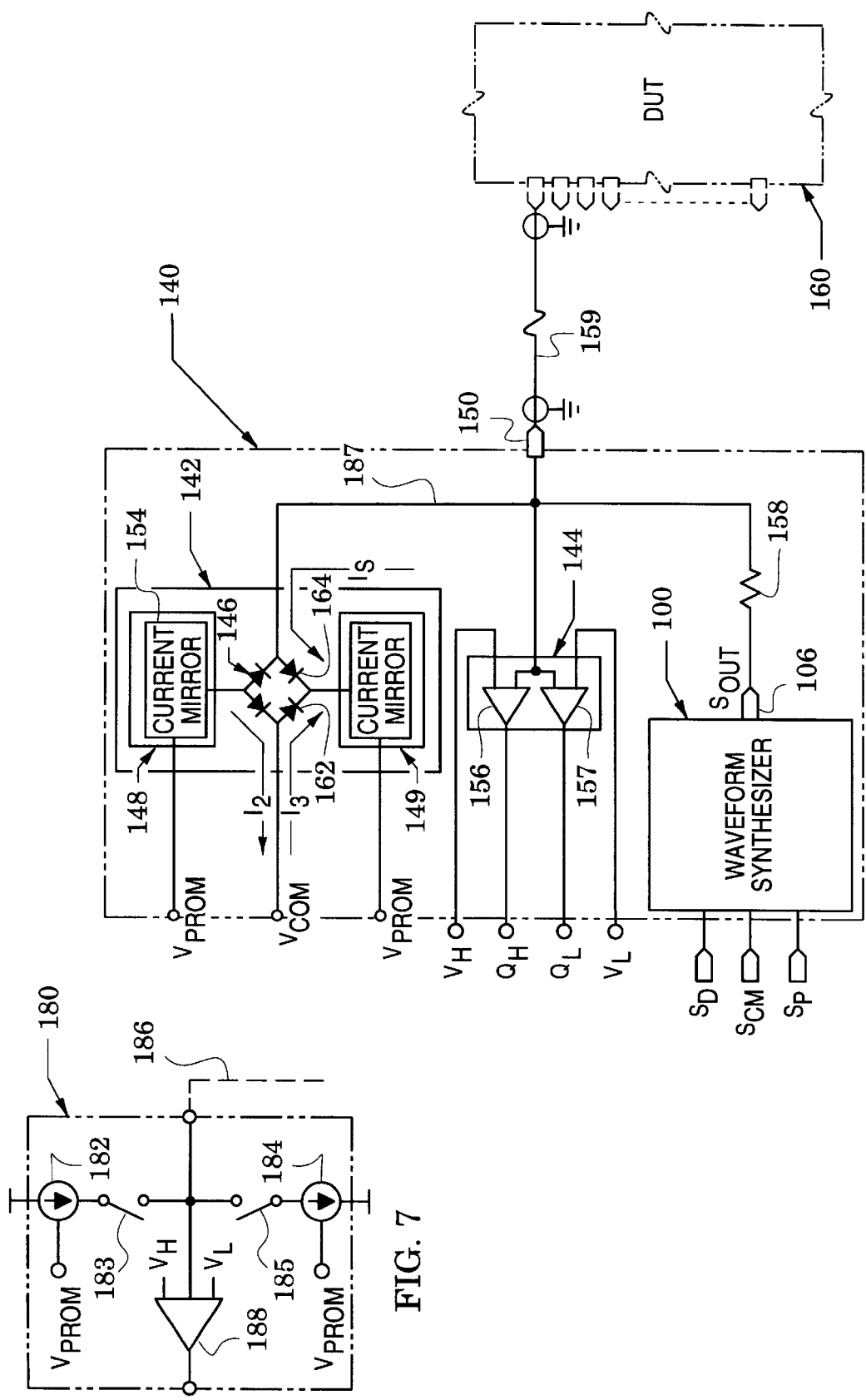

WIDE DYNAMIC-RANGE CURRENT SWITCHES AND SWITCHING METHODS

BACKGROUND OF THE INVENTION

1. Field of the Invention

The present invention relates generally to current switches and, more particularly, to switches in which the switched current varies over a wide range.

2. Description of the Related Art

Although a majority of transistor current switches are used to switch a current having a substantially fixed magnitude, an important need exists for switches that can properly switch variable currents. Conventional current switches may exhibit significant timing errors in high-speed switching applications because their signal transit time varies excessively with respect to the current magnitude.

Transit time through a switching transistor is related to its transition frequency $f_T$ which is the frequency at which the short-circuit, common-emitter current gain falls to unity. It has been shown (e.g., see Paul R. Gray and Robert G. Meyer, *Analysis and Design of Analog Integrated Circuits,* John Wiley and Sons, New York, 1993, pp. 30–45) that a transistor's $f_T$ is related to its device capacitances (e.g., base-emitter and base-collector junction capacitances) and its transconductance.

Because transconductance is a function of emitter current, $f_T$ approaches a constant value at high currents. At low current values, device capacitances dominate and, accordingly, $f_T$ falls with decreasing current. Other effects (e.g., increased base transit time due to high-level injection) cause $f_T$ to fall again at very high currents.

These relationships are illustrated in the graph 10 of FIG. 1 which shows a plot 12 of an exemplary transistor's $f_T$ as a function of the transistor's emitter current. Because device capacitances are directly related to device size, a switching transistor can be "sized" to optimize its performance when switching a specified current magnitude. Accordingly, the exemplary transistor has been sized to maximize its $f_T$ at an emitter current of ~100 milliamps and it can be seen that $f_T$ has fallen to nearly 10% of its peak value at an emitter current of 1 milliamp.

The dynamic range of a variable-current switching device is typically defined as the difference between the minimum and maximum currents that can be switched without exceeding a specified signal transit-time window. In a switching application in which the signal transit-time window is narrow and the minimum current is zero, the wide variation of $f_T$ in FIG. 1 indicates that the exemplary transistor will have a limited dynamic range.

SUMMARY OF THE INVENTION

The present invention is directed to current switches that significantly reduce signal transit-time variations when switching current signals that have a wide range of current magnitudes. Accordingly, the invention enhances the dynamic range of current switches.

These objectives are achieved with the realization that transit-time variations can be reduced by shifting the range of the currents that are carried by switching transistors. In particular, a current range is shifted upward to a higher current range in which the variation of the transistors' transition frequency $f_T$ is reduced.

Switches of the invention switch a signal current between first and second output ports in response to a control signal. They include a first differential pair of first and second transistors, an offset current source that generates an offset current and a current-steering system. Either of the transistors can be selected to steer the signal current to a respective one of the output ports. Simultaneously, the current-steering system steers the offset current along a current path that includes the selected transistor and excludes the respective output port.

Accordingly, the selected transistor conducts a current whose magnitude is at least that of the offset current to shift the transistor's current range upwards and thereby enhance its dynamic range. Preferably, the offset current has a magnitude between the minimum current and the maximum current.

In switch embodiments, the offset current is formed with substantially equal first and second offset currents and the first differential pair also steers the first offset current through the selected transistor to the respective output port. A second differential pair steers the second offset current to a different output port that differs from the respective output port and first and second correction currents are coupled to the first and second output ports. Because the first and second correction currents substantially equal the first and second offset currents, they cancel the first offset current at the respective output port and cancel the second offset current at the different output port.

The teachings of the invention also include waveform analyzers and test interface circuits whose performance is enhanced by inclusion of the invention's current switches.

The novel features of the invention are set forth with particularity in the appended claims. The invention will be best understood from the following description when read in conjunction with the accompanying drawings.

BRIEF DESCRIPTION OF THE DRAWINGS

FIG. 6 is a schematic of a test interface circuit that includes the waveform synthesizer of FIG. 4; and FIG. 7 is a schematic of another comparator and active load for the test interface circuit of FIG. 6.

DETAILED DESCRIPTION OF THE PREFERRED EMBODIMENTS

Figure 2:
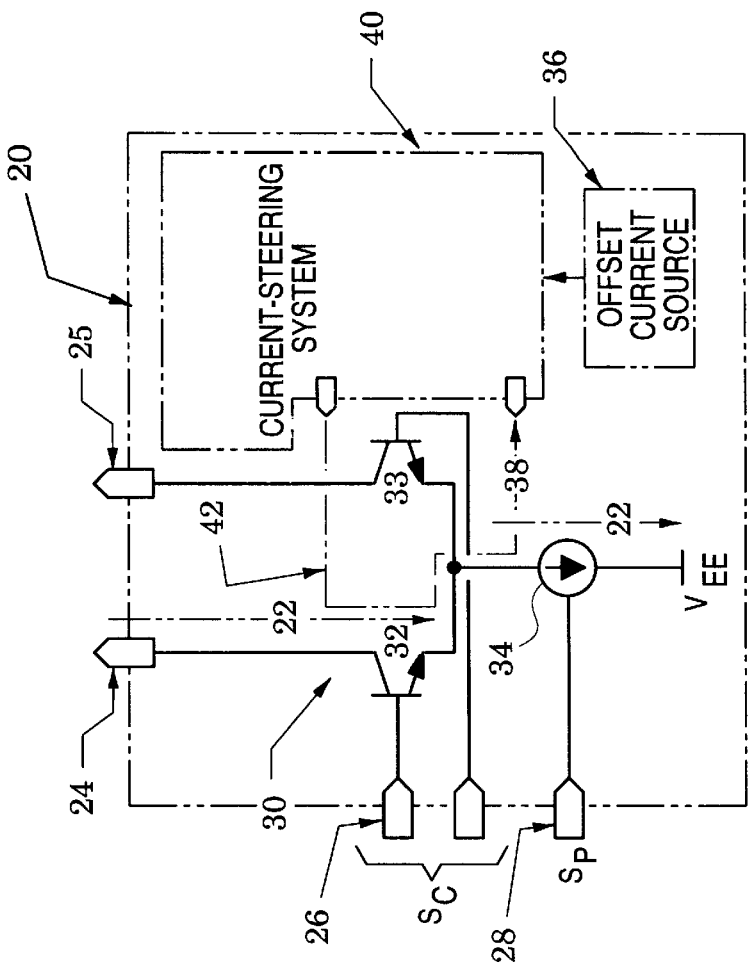
FIG. 2 is a schematic of a wide-dynamic current switch of the present invention.

FIG. 2 illustrates a current switch embodiment 20 that switches a signal current 22 between first and second output ports 24 and 25 in response to a control signal $S_C$ at a control port 28 and varies the magnitude of the signal current in response to a program signal $S_P$ at a program port 28. Because of its structure, the current switch 20 is especially suited for use in switching applications that require a wide dynamic range.

In particular, the current switch 20 includes a first differential pair 30 of transistors 32 and 33, a signal current source 34 that provides the signal current 22, an offset current source 36 that provides an offset current 38 and a current-steering system 40 that directs the offset current 38 to enhance the switch's dynamic range. The first differential pair 30 is coupled to the signal current source 34 and the first and second transistors 32 and 33 are respectively coupled to the first and second output ports 24 and 25.

In operation of the current switch 20, the first differential pair 30 responds to the control signal $S_C$ by steering the signal current 22 through a selected transistor of either of the first and second transistors 32 and 33 to their respective first and second output ports 24 and 25. Simultaneously, the current-steering system 40 responds to the control signal $S_C$ by steering the offset current 38 along a current path 42 that includes the selected transistor but excludes the respective output port.

For illustrative purposes, the selected transistor and respective output port are shown in FIG. 2 to be the transistor 32 and the output port 24. Accordingly, the current path 42 passes through the selected transistor 32 but excludes the respective port 24. Therefore, the current switch 20 switches the signal current 22 between output ports 24 and 25 while the selected transistor 32 conducts a current equal to the sum of the signal and offset currents.

Figure 1:
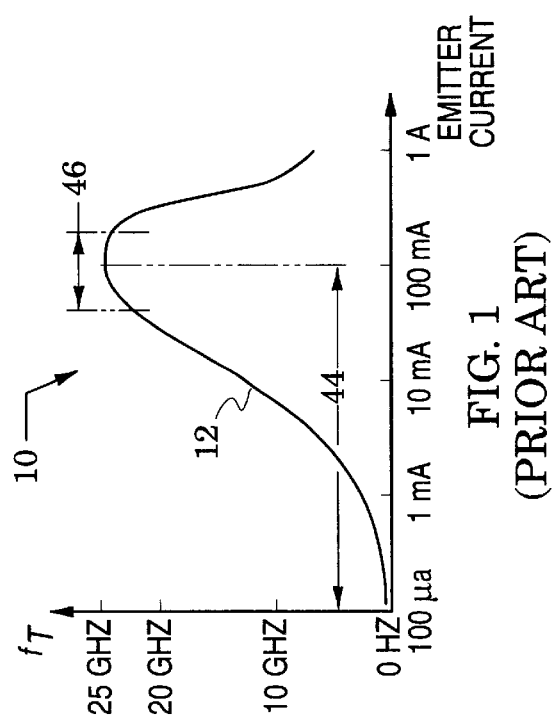
FIG. 1 is a graph of the transition frequency of an exemplary transistor as a function of the transistor's emitter current.

Because it causes the selected transistor to conduct a current whose magnitude is at least that of the first offset current 38, the structure of the current switch 20 enhances the switch's dynamic range. This can be demonstrated by assuming that the plot 12 of FIG. 1 represents the transition frequency $f_T$ of the transistors 32 and 33 and the signal current (22 in FIG. 2) varies over a current range 44 of 0–100 milliamps.

If the offset current (38 in FIG. 2) is selected to be 50 milliamps, the current range carried by the transistors (32 and 34 in FIG. 2) is shifted from the current range 44 to the current range 46 of 50–150 milliamps (note that the axes of the graph 10 are logarithmic). Because the $f_T$ variation over the range 48 is significantly reduced from that over the range 46, transit-time variations of the transistors 32 and 33 is also significantly reduced which causes a substantial increase in the dynamic range of the current switch 20.

Figure 3A:
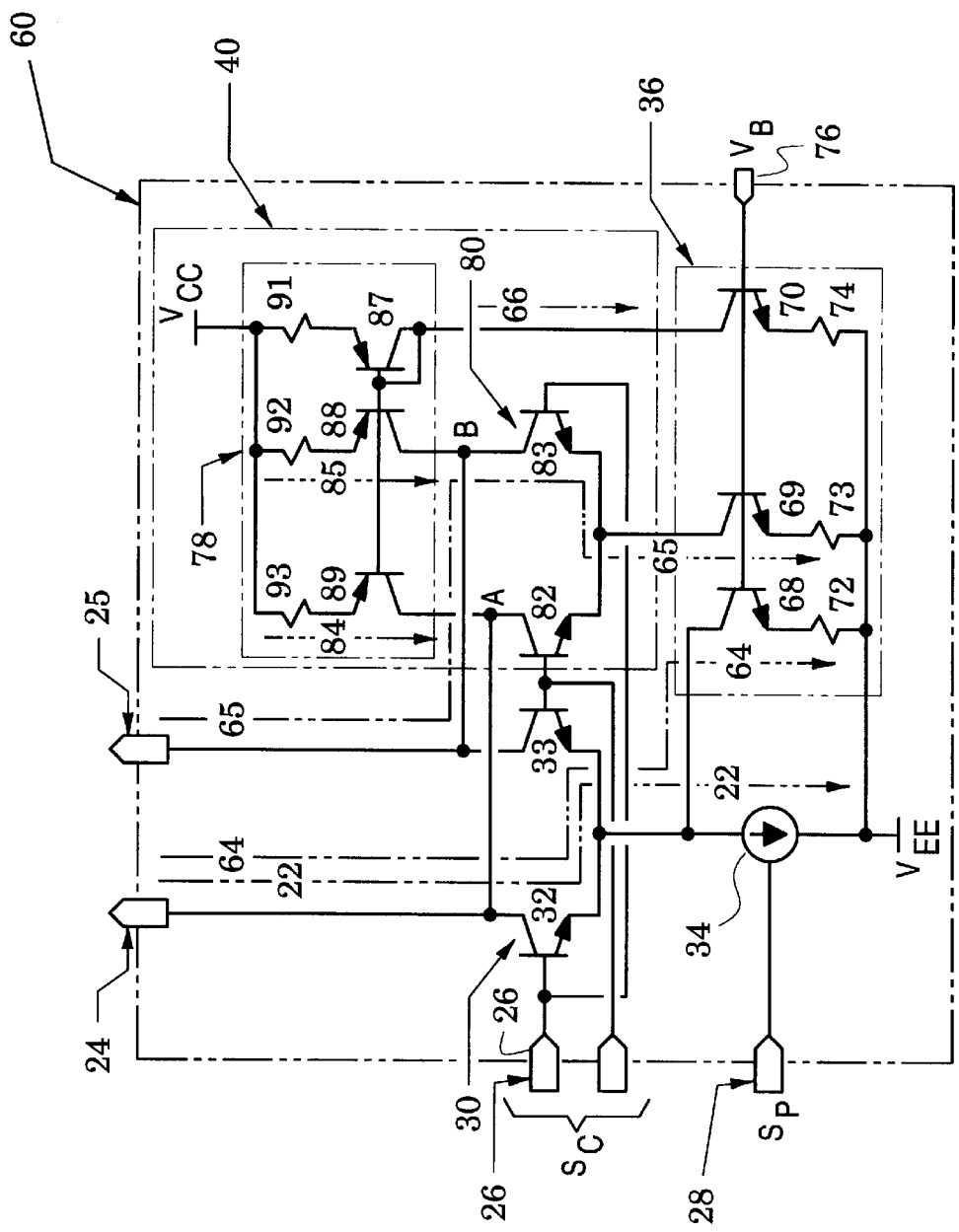
FIGS. 3A and 3B are schematics of another embodiment of the current switch of FIG. 2.

FIG. 3A illustrates an embodiment 60 of the current switch 20 of FIG. 2. Portions of the current switch 60 are similar to portions of the current switch 20 with like elements indicated by like reference numbers. In the current switch 60, however, the offset current source 36 provides substantially equal first and second offset currents 64 and 65 and also provides a third current 66. These currents are generated by transistors 68, 69 and 70 that are respectively coupled to a voltage potential $V_{EE}$ by resistors 72, 73 and 74 and that are coupled to a common bias potential $V_B$ at a bias port 76 (it is noted in passing that similar structure can form one embodiment of the programmable signal current source 34). The first offset current 64 is substantially the offset current 38 of FIG. 2 but is numbered differently to facilitate an operational description of the current switch 60.

In the current switch 60, the current steering system 40 includes a current mirror 78 and a second differential pair 80 of transistors 82 and 83 that are respectively coupled to the first and second output ports 24 and 25. The first differential pair 30 is coupled to the current source 36 to receive the first offset current 64 and the second differential pair 80 is coupled to the current source 36 to receive the second offset current 65. The first and second differential pairs are coupled in a complementary arrangement to the control port 26, i.e., they are coupled so that transistors 32 and 83 are simultaneously on and transistors 33 and 82 are simultaneously on.

The current mirror 78 receives the third current 66 from the current source 36 and, in response, provides first and second correction currents 84 and 85. The current mirror includes a diode-coupled transistor 87 and transistors 88 and 89 that are all respectively coupled to a voltage potential $V_{CC}$ by resistors 91, 92 and 93. The transistors 88 and 89 are biased by the diode-coupled transistor 87 and resistors 91, 92 and 93 are selected so that the first and second correction currents 84 and 85 are substantially equal to each other and to the first and second offset currents 64 and 65.

An operational description of the current switch 60 is simplified by separating it into first and second descriptions wherein the first description ignores the operation of the current mirror 78. FIG. 3A is therefore repeated as FIG. 3B and the two figures respectively facilitate the first and second descriptions.

In FIG. 3A, it is initially assumed that the polarity of the control signal $S_C$ at the control port 26 is such as to bias transistor 32 on and bias transistor 33 off so that the differential pair 30 steers the signal current 22 and the first offset current 64 through the transistor 32 and to its respective output port 24 as indicated in FIG. 3A. With the assumed polarity of the control signal, transistor 82 will be biased off and transistor 83 will be biased on so that the differential pair 80 steers the second offset current 65 through the transistor 83 and to its respective output port 25 as also indicated in FIG. 3A.

At this point, it is observed that the signal current 22 and the first offset current 64 are steered to the first output port 24 and the second offset current 65 is steered to the second output port 25. It is apparent that this pattern will be reversed when the polarity of the control signal $S_C$ is inverted. With that inversion, the signal current 22 and the first offset current 64 are steered to the second output port 25 and the second offset current 65 is steered to the first output port 24. With either polarity of the control signal $S_C$, the signal current is steered through a selected transistor of the first differential pair 30 to a respective output port and the second offset current 65 is steered to a different output port (i.e., different from the respective output port).

The signal current 22 and the first offset current 64 are therefore both steered through the selected transistor and the signal current 22 is steered to the respective port to realize the currents of FIG. 2 (i.e., currents 22 and 38) that enhance the dynamic range of the current switch while switching the signal current. It is not intended, however, that other currents (i.e., the currents 64 and 65) be directed to the output ports.

Figure 3B:
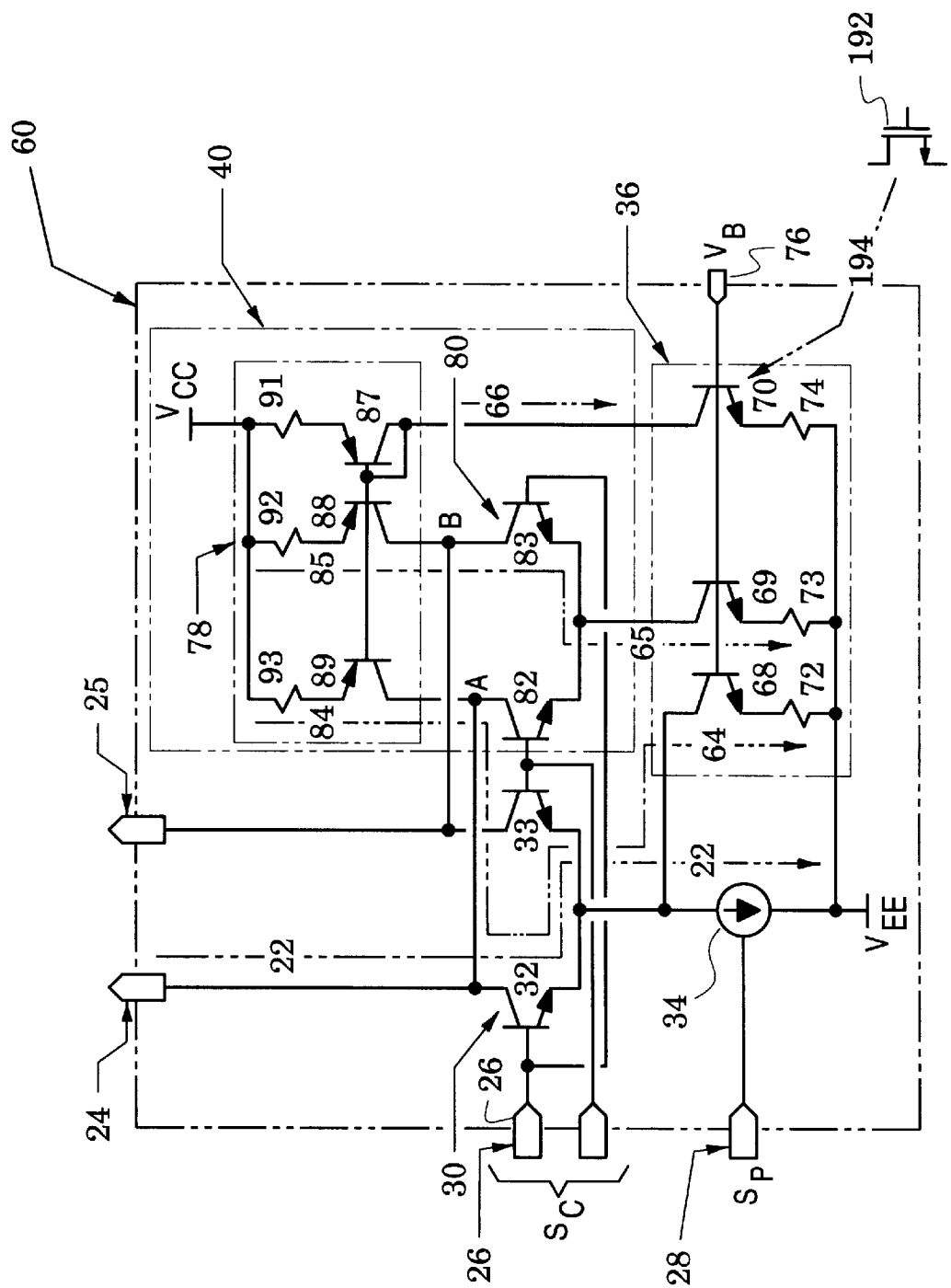

Accordingly, attention is now directed to FIG. 3B to describe operation of the current mirror 78. As shown in FIG. 3A, the current mirror 78 is arranged to direct the first and second correction currents 84 and 85 to circuit nodes A and B respectively wherein nodes A and B are on circuit paths that respectively connect to output ports 24 and 25.

It was assumed above (relative to FIG. 3A) that transistors 32 and 83 are biased on by the control signal $S_C$. Because transistor 83 is on, the second correction current 85 at circuit node B is directed through the second differential pair 80. The second correction current 85 therefore cancels the second offset current 65 at the different output port (second output port 25) and flows from circuit node B to become the second offset current 65 of the offset current source 36.

Because transistor 82 is off, current cannot flow from circuit node A through this transistor. Accordingly, the first correction current 84 is diverted at circuit node A and directed through the first differential pair 80. The first correction current 85 therefore cancels the first offset current 64 at the respective output port (first output port 24) and flows from circuit node A through the selected transistor (transistor 32) to become the first offset current 64 of the offset current source 36.

The operation shown in FIGS. 3A and 3B therefore steers the signal current 22 through a selected transistor to a respective output port and steers the first offset current 64 through the selected transistor (i.e., along circuit path 42 of FIG. 2) to enhance the dynamic range of the current switch 60. A similar operation can be described for the case in which transistor 33 is the selected transistor and output port 25 is the respective output port.

Figures 4, 5:
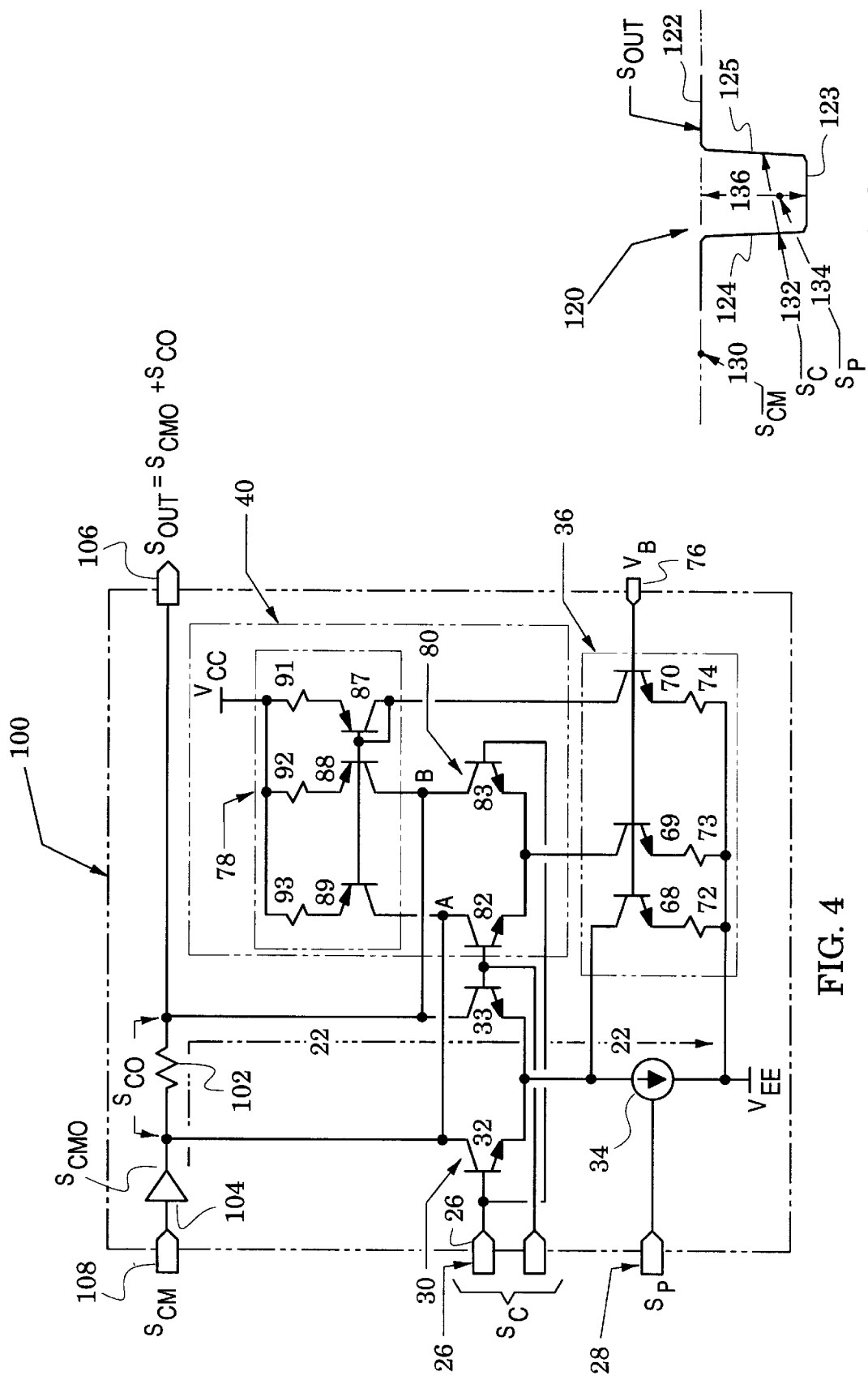
FIG. 4 is a schematic of a waveform synthesizer that includes the current switch of FIGS. 3A and 3B.
FIG. 5 is a diagram of an output waveform generated by the waveform synthesizer of FIG. 4.

FIG. 4 illustrates a waveform synthesizer 100 that couples the first and second output ports (24 and 25) of the current switch 60 of FIGS. 3A and 3B to either side of a resistor 102. The resistor is connected between a buffer amplifier 104 and an output port 106 and an input port 108 is connected to the input of the amplifier. Preferably, the amplifier 104 has an output impedance which is much less than the impedance of the resistor 102.

In operation of the waveform synthesizer 100, a common-mode input signal $S_{CM}$ is applied at the input port 108 to generate a common-mode output signal $S_{CMO}$ at the output of the amplifier 104. In a first operational mode, the control signal $S_C$ steers the signal current 22 through the transistor 33 as shown in FIG. 4. The signal current flows out of the low output impedance of the amplifier 20 and through the resistor 102 to develop a control output signal $S_{CO}$ across the resistor. Therefore, the output signal $S_{OUT}$ is the sum of the common-mode output signal $S_{CMO}$ and the control output signal $S_{CO}$ as indicated in FIG. 4.

In a second operational mode, the control signal $S_C$ steers the signal current 22 through the transistor 32 (as in FIG. 3B). The signal current flows out of the amplifier 20 and no signal is generated across the resistor 102. In this mode, the control output signal $S_{CO}$ is zero and the output signal $S_{OUT}$ simply equals the common-mode output signal $S_{CMO}$.

The waveform synthesizer 100 generates a variety of waveforms at its output port 106. FIG. 5 illustrates an exemplary waveform 120 that has upper and lower levels 122 and 123 and falling and rising edges 124 and 125. As shown by response arrows 130, 132 and 134, the shape of the output waveform 120 responds to the common-mode signal $S_{CM}$, the control signal $S_C$ and the program signal Sp of FIG. 4.

In particular, the upper level 122 moves up and down in response to the common-mode signal $S_{CM}$ and the locations of falling and rising edges 124 and 125 are determined by the control signal $S_C$ as it respectively steers the signal current 22 through transistors 33 and 32 of the first differential pair 30 (see FIG. 4). Finally, the signal amplitude 136 (between upper and lower signal levels 122 and 123) is determined by the program signal $S_P$ because the amplitude 136 is directly responsive to the amplitude of the signal current as it flows through the resistor (102 in FIG. 4). Thus the levels 122 and 123, timing locations of the edges 124 and 125 and the signal amplitude 136 are completely and independently controlled by the common-mode signal $S_{CM}$, the control signal $S_C$ and the program signal $S_P$.

Preferably, the timing locations of the edges 124 and 125 remain fixed as the amplitude of the signal current is adjusted to alter the signal amplitude 136. As shown above, the dynamic range of the current switch 60 is enhanced because an offset current (64 in FIG. 3B) is always summed with the signal current as it is steered through a selected transistor (32 in FIG. 3B). Therefore, variations of the selected transistor's transition frequency $f_T$ are significantly reduced and, therefore, variations in signal transit time through the switch are also significantly reduced. Accordingly, timing locations of the edges 124 and 125 in FIG. 5 are stabilized as the magnitude of the signal current (22 in FIG. 3B) is reduced to reduce the signal amplitude 136.

The waveform synthesizer 100 is particularly suited for applications in automatic test equipment (ATE) where it would generate and apply test signals for electronic devices under test (DUT). In this application, the control signal would typically be referred to as a "data signal" and the synthesizer would typically be referred to as a "pin driver". (i.e., a signal generator that applies a test signal to a pin of a DUT).

FIG. 6 illustrates a test interface circuit 140 that combines a programmable active load 142 and a response comparator 144 with the waveform synthesizer 100 of FIG. 4. The active load positions a diode bridge 146 between programmable current sources 148 and 149. One side of the bridge is supplied with a commutation voltage $V_{COM}$ and the other side is coupled to a terminal 150 that can be configured to contact a DUT component, e.g., a DUT pin or lead. The current sources are typically formed with current mirrors 154 whose current magnitudes respond to programmable voltages $V_{PROM}$.

The response comparator 144 is typically a window comparator formed with first and second comparators 156 and 157 that each have an input coupled to the terminal 150 and another input respectively connected to programmable high and low reference voltages $V_H$ and $V_L$. Comparator output signals appear at ports $Q_H$ and $Q_L$ and indicate whether DUT response signals are within the range $Q_H$-$Q_L$ or not. The output port 106 of the waveform synthesizer 100 may be coupled to the terminal 150 by an isolation resistor 158 that reduces interference with DUT response signals.

Because it includes the waveform synthesizer 100, the comparator 144 and the active load 142 and because the waveform synthesizer is employed as a pin driver, the interface circuit 140 is sometimes referred to as a driver/comparator/load (DCL) module. The interface circuit 140 is typically coupled through a transmission line 159 to a DUT 160. In operation of the interface circuit, it generates and applies precise test waveforms with its waveform synthesizer 100, measures DUT response signals with its response comparator 144 and applies specified current sinks or sources with its active load 142. The flexible but relatively simple and inexpensive structure of the interface circuit 140 facilitates its use in large numbers in ATEs for simultaneous testing of DUT leads.

In an exemplary test of a DUT that is to source 1 milliamp while delivering 5 volts at the terminal 150, the current source 149 would be set to sink 1 milliamp and the commutation voltage $V_{COM}$ set to a voltage less than 5 volts. If the DUT meets its specifications, its source current $I_S$ flows as shown to the current source 149 while a second current $I_2$ flows from the current source 148 and through the other side of the bridge 146. If the DUT cannot source the specified 1 milliamp, a third current $I_3$ flows through diode 162 so that $I_S+I_3$ equals the 1 milliamp sink current of the current source 149. Because diodes 162 and 164 are now both in conduction, the voltage at the terminal 150 must equal $V_{COM}$. The fact this is below the DUTs specified 5 volts is sensed by the comparator 144.

The teachings of the interface circuit 140 can be practiced with a variety of conventional comparator and active load circuits. The general structure of such circuits is exemplified in the circuit 180 of FIG. 7 which couples programmable current sources 182 and 184 to the terminal 150 with switches 183 and 185 (via a lead 186 which is similar to a lead 187 of FIG. 6). The potential of the terminal 150 is measured with a window comparator 188. A specified source or sink current can thus be switched to the terminal 150 while a DUT response at the terminal 150 is measured and compared to a DUT specification.

Although description of the invention has been clarified by inclusion of a programmable current source (e.g., 34 in FIG. 2), switches of the invention do not require such inclusion.

The invention has been illustrated with reference to particular transistors, e.g., the bipolar transistors of FIG. 3B. However, the teachings of the invention may be practiced with various transistor types such as MOS transistors. This is exemplified in FIG. where a MOS transistor 192 replaces the bipolar transistor 70 as indicated by a replacement arrow 194.

Waveform synthesizers of the invention are suitable for the generation of high-speed (e.g.,~1 GHz) waveforms with fast rise and fall times (e.g.,~100 picoseconds). The timing locations of rising and falling edges is stabilized by the wide dynamic range of the current switches of the invention. The waveform synthesizers are particularly suited for use as ATE pin drivers and for their realization as application specific integrated circuits (ASICs) which can significantly reduce their size and cost when produced in large volumes.

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A wide dynamic-range switch that switches a signal current between first and second output ports in response to a control signal wherein the magnitude of said signal current varies between a minimum current and a maximum current, the switch comprising:

a first differential pair of first and second transistors that are respectively coupled to said first and second output ports and said first differential pair is coupled to receive said signal current and steer it, in response to said control signal, through a selected transistor of either of said first and second transistors to its respective output port of said first and second output ports;

an offset current source that generates an offset current; and a current-steering system that steers in response to said control signal, said offset current along a current path that includes said selected transistor and excludes said respective output port;

said selected transistor thus conducting a current whose magnitude is at least that of said offset current to thereby enhance its dynamic range;

wherein:

said offset current source is configured to generate said offset current in the form of substantially equal first and second offset currents;

said first differential pair is also coupled to said offset current source to steer, in response to said control signal, said first offset current through said selected transistor to said respective output port;

and said current-steering system includes:

a second differential pair of third and fourth transistors that are respectively coupled to said first and second output ports wherein said second differential pair is coupled to said offset current source to steer, in response to said control signal, said second offset current to a different output port that differs from said respective output port; and a correction current source that couples substantially equal first and second correction currents to said first and second output ports respectively wherein said first and second correction currents are substantially equal to said first and second offset currents;

one of said first and second correction currents thereby directed through said selected transistor to cancel said first offset current at said respective output port;

the other of said first and second correction currents thereby directed through said second differential pair to cancel said second offset current at said different output port; and said first offset current thereby steered along said current path that includes said selected transistor and excludes said respective output port.

2. The switch of claim 1, wherein said first and second differential pairs are coupled together so that said first and fourth transistors are simultaneously on and said second and third transistors are simultaneously on.

3. The switch of claim 1, wherein:

said offset current source includes first, second and third current transistors that are biased to respectively provide said first offset current, said second offset current and a third current in response to a common bias signal; and said correction current source is a current mirror that generates said first and second correction currents in response to said third current.

4. The switch of claim 1, further including a programmable signal current source that generates said signal current.

5. The switch of claim 1, wherein:

bases of said first and fourth transistors are coupled together and bases of said second and third transistors are coupled together;

collectors of said first and third transistors are coupled to said first output port and collectors of said second and fourth transistors are coupled to said second output port;

emitters of said first and second transistors are coupled to a signal current source and said offset current source and emitters of said third and fourth transistors are coupled to said offset current source.

6. The switch of claim 1, wherein said first, second, third and fourth transistors are bipolar transistors.

7. The switch of claim 1, wherein said first, second, third and fourth transistors are MOS transistors.

8. The switch of claim 1, wherein said offset current has a magnitude between said minimum current and said maximum current.

9. A method of enhancing the dynamic range of transistors that switch a signal current between first and second output ports in response to a control signal wherein said signal current varies between a minimum current and a maximum current, the method comprising:

coupling first and second transistors respectively to said first and second output ports;

in response to said control signal, steering said signal current through a selected transistor of either of first and second transistors to its respective output port of said first and second output ports; and in response to said control signal, directing an offset current along a current path that includes said selected transistor and excludes said respective output port;

said selected transistor thus conducting a current whose magnitude is at least that of said offset current to thereby enhance its dynamic range;

wherein said offset current comprises substantially equal first and second offset currents and said directing step includes the steps of:

in response to said control signal, steering said first offset current through said selected transistor to said respective output port;

in response to said control signal, steering said second offset current to a different output port that differs from the output port coupled to said selected transistor;

providing first and second correction currents that are substantially equal to said first and second offset currents;

directing one of said first and second correction currents through said selected transistor to cancel said first offset current at said respective output port; and directing the other of said first and second correction currents to cancel said second offset current at said different output port.

10. The method of claim 9, further including the step of arranging said first and second transistors as a differential pair.

11. The method of claim 9, wherein said first and second transistors are bipolar transistors.

12. The method of claim 9, wherein said first and second transistors are MOS transistors.

13. The method of claim 9, further including the step of selecting the magnitude of said offset current to be between said minimum current and said maximum current.

* * * * *